(12) United States Patent
Lai et al.

(10) Patent No.: US 7,746,642 B2
(45) Date of Patent: Jun. 29, 2010

(54) HEAT SINK AND A METHOD FOR MANUFACTURING THE SAME

(75) Inventors: Chi-Yuan Lai, Taipei Hsien (TW); Zhi-Yong Zhou, Shenzhen (CN); Cheng-Tien Lai, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/202,393

(22) Filed: Sep. 1, 2008

(65) Prior Publication Data

US 2009/0225518 A1 Sep. 10, 2009

(30) Foreign Application Priority Data

Mar. 7, 2008 (CN) .................... 2008 1 0065788

(51) Int. Cl.
*H05K 7/20* (2006.01)
(52) U.S. Cl. ............... 361/700; 361/704; 361/707; 361/719; 174/15.2; 257/715; 165/80.4; 165/104.26
(58) Field of Classification Search ............... None
See application file for complete search history.

(56) References Cited

U.S. PATENT DOCUMENTS

| | | | | |
|---|---|---|---|---|
| 6,397,941 B1* | 6/2002 | McCullough | ............... | 165/185 |
| 7,278,470 B2* | 10/2007 | Xia et al. | ............... | 165/104.33 |
| 7,343,962 B2* | 3/2008 | Xia et al. | ............... | 165/80.3 |
| 7,443,680 B1* | 10/2008 | Peng et al. | ............... | 361/704 |
| 7,447,035 B2* | 11/2008 | Liu et al. | ............... | 361/719 |
| 7,493,939 B2* | 2/2009 | Xia et al. | ............... | 165/104.26 |
| 7,495,920 B2* | 2/2009 | Chen et al. | ............... | 361/719 |
| 7,520,316 B2* | 4/2009 | Xia et al. | ............... | 165/104.33 |
| 7,576,986 B2* | 8/2009 | Chou et al. | ............... | 361/700 |
| 2007/0188995 A1* | 8/2007 | Franz et al. | ............... | 361/704 |
| 2008/0055855 A1* | 3/2008 | Kamath et al. | ............... | 361/700 |
| 2008/0128118 A1* | 6/2008 | Chen et al. | ............... | 165/104.33 |
| 2009/0159252 A1* | 6/2009 | Lai et al. | ............... | 165/171 |

* cited by examiner

*Primary Examiner*—Boris L Chervinsky
(74) *Attorney, Agent, or Firm*—Frank R. Niranjan

(57) ABSTRACT

A heat sink for cooling an electronic component includes a lower plate, an upper plate, an upper fin set and a lower fin set respectively fixed on the upper plate and the lower plate, and a plurality of heat pipes sandwiched between the upper plate and the lower plate. The lower plate forms a protrusion projecting downwardly therefrom. A bottom surface of the protrusion is milled to be flat and smooth, whereby the bottom surface can intimately contact the electronic component. A method for manufacturing the heat sink comprising milling a bottom surface of a protrusion punched downwardly from a lower plate, whereby the bottom surface can be flat and smooth sufficiently to have an intimate contact with an electronic component, and sequentially welding an upper plate on the lower plate and a plurality of fins on the lower plate and the upper plate, respectively.

14 Claims, 5 Drawing Sheets

HEAT SINK AND A METHOD FOR MANUFACTURING THE SAME

BACKGROUND OF THE INVENTION

1. Field of the Invention

The present invention relates to a heat sink and a method manufacturing the same, and more particularly to a heat sink having a downward protruded surface which is milled for being in intimate contact with an electronic component to be cooled and a method manufacturing the heat sink.

2. Description of Related Art

The central processing unit (CPU) mounted on the motherboard in a computer is the center of operations of the computer. During the operations of the computer, the CPU produces heat. The heat must be quickly carried away from the CPU during the operations of the computer. Accordingly, a heat sink is used to remove the heat from the CPU.

Conventionally, a heat sink includes a metal base contacting the CPU to absorb heat therefrom, and a plurality of fins extending from the base to dissipate the heat to an ambient atmosphere.

The metal base has a bottom surface contacting with a top surface of the CPU. To enable the bottom surface and the top surface to have an intimate engagement therebetween, the bottom surface is milled to be highly flat and smooth. In the conventional heat sink, an entirety of the bottom surface of the metal base is milled, which is time consuming and costly.

What is needed, therefore, is a heat sink which can overcome the above-mentioned disadvantages.

SUMMARY OF THE INVENTION

A heat sink for cooling an electronic component includes a lower plate, an upper plate, an upper fin set and a lower fin set respectively fixed on the upper plate and the lower plate, and a plurality of heat pipes sandwiched between the upper plate and the lower plate. The lower plate forms a protrusion projecting downwards therefrom. A bottom surface of the downward protrusion is milled to be highly flat and smooth so it can have an intimate contact the electronic component. Thus, heat generated by the electronic component can be timely and sufficiently transferred to the heat sink by such an intimate contact between the protrusion and the electronic component. In addition, the present invention also discloses a method for manufacturing the heat sink, comprising milling a bottom surface of a protrusion punched downwardly from a lower plate so that the bottom surface is highly smooth and flat. Sequentially, an upper plate is welded on the lower plate with a plurality of heat pipes sandwiched between the upper and lower plates, and a plurality of fins are soldered on the lower plate and the upper plate, respectively.

Other advantages and novel features of the present invention will become more apparent from the following detailed description when taken in conjunction with the accompanying drawings.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
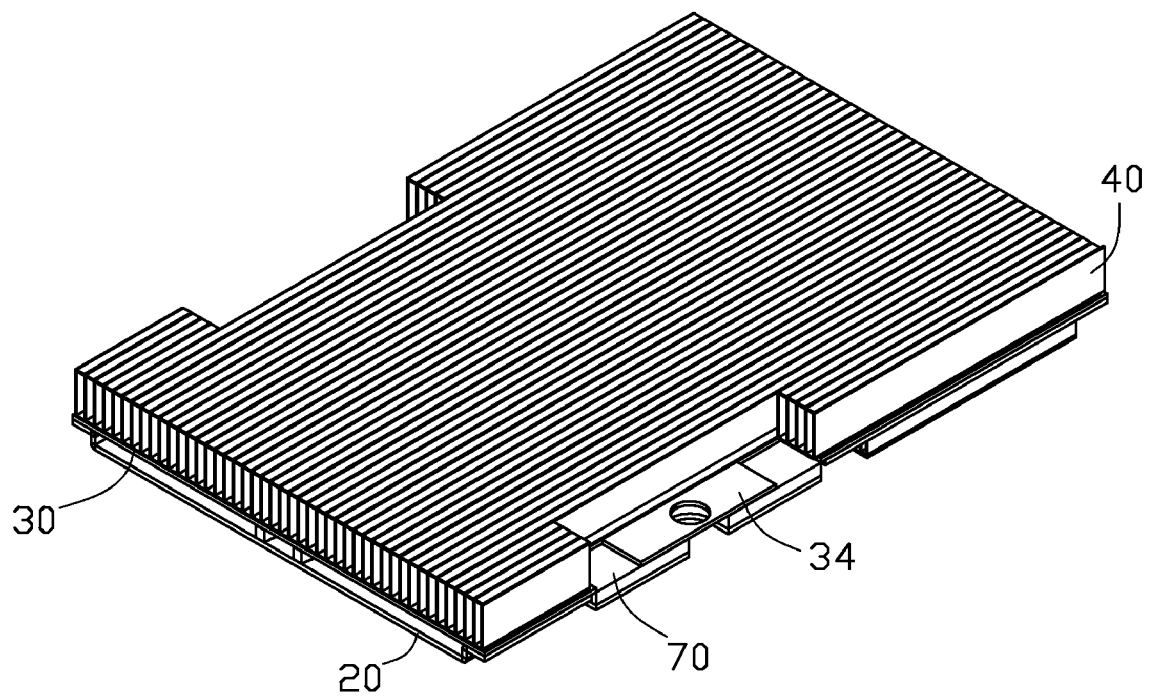
FIG. 1 is an assembled, perspective view of a heat sink in accordance with a preferred embodiment of the present invention.
Figure 2:
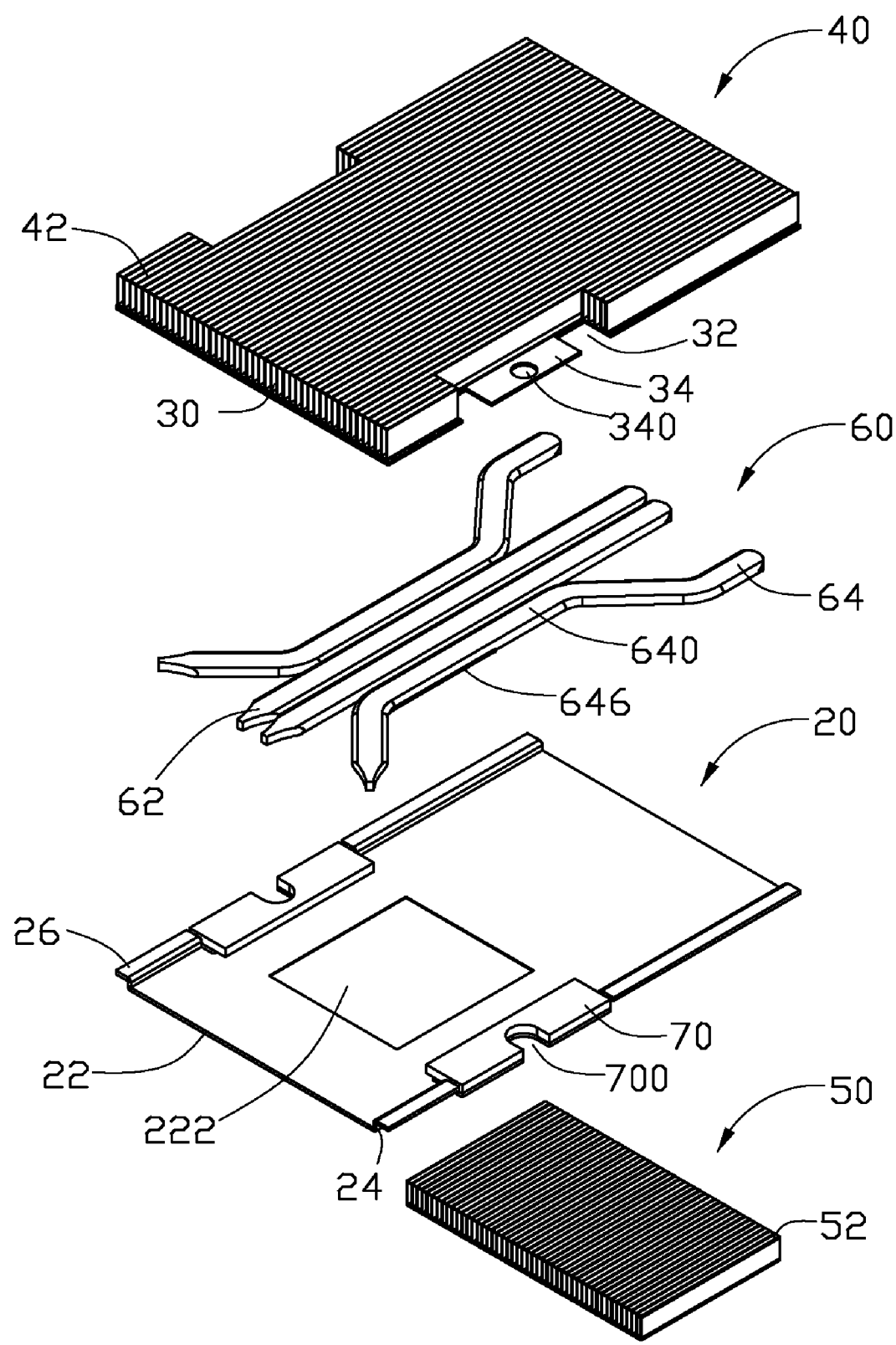
FIG. 2 is an exploded view of FIG. 1.
Figure 5:
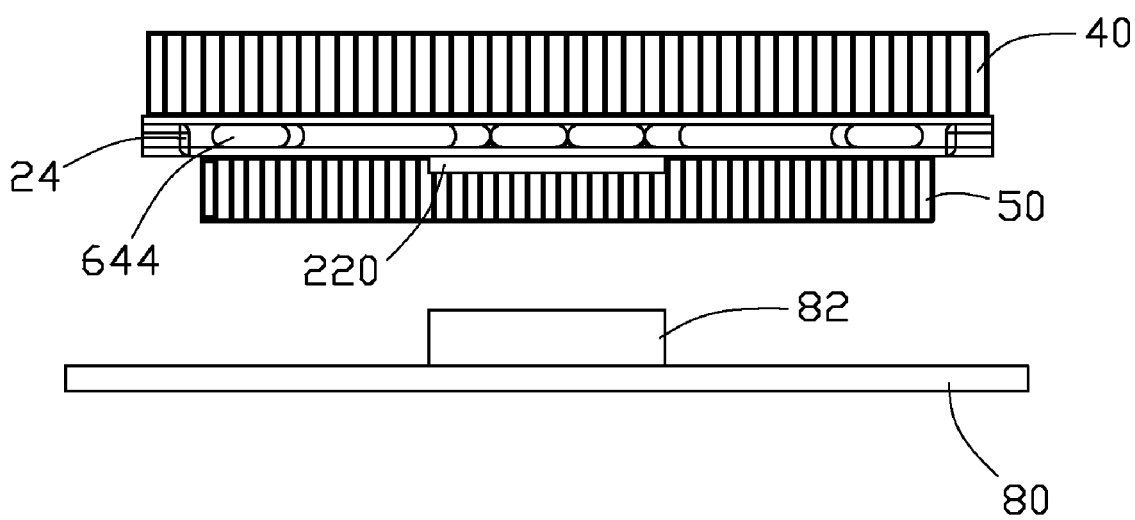
FIG. 5 is a front view of FIG. 1, wherein a printed circuit board with an electronic component mounted thereon is placed beneath the heat sink.

Referring to FIGS. 1-2 and 5, a heat sink 10 in accordance with a preferred embodiment of the present invention is for thermally contacting an electronic component 82 which is mounted on a printed circuit board 80 (see FIG. 5), to dissipate heat therefrom. The heat sink 10 comprises a lower plate 20, an upper plate 30, a plurality of heat pipes 60 sandwiched between the lower plate 20 and the upper plate 30, and an upper fin set 40 and a lower fin set 50 attached on a top of the upper plate 30 and a bottom of the lower plate 20, respectively.

Figure 4:
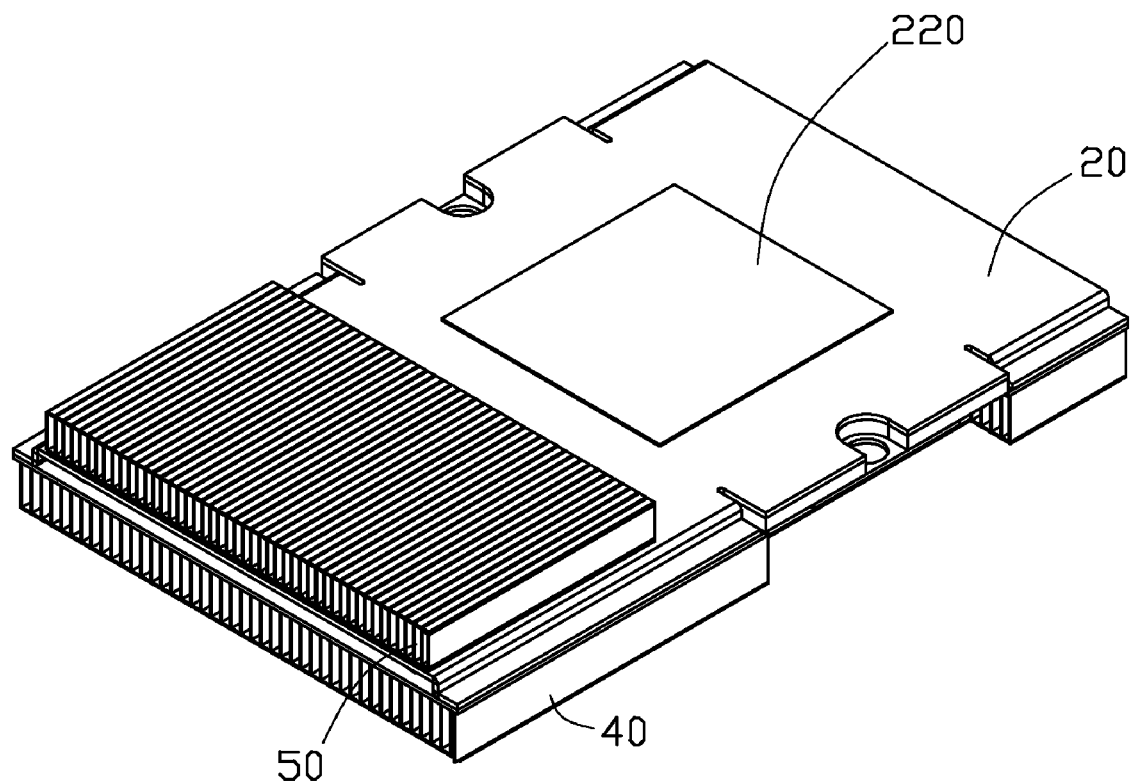
FIG. 4 is an inverted view of FIG. 1.

Also referring to FIG. 4, the lower plate 20 is made by stamping a metal plate, and comprises a rectangular and planar panel 22, a pair of sidewalls 24 extending upwardly and perpendicularly from two opposite lateral sides of the panel 22, and a pair of flanges 26 formed horizontally and oppositely from tops of the pair of sidewalls 24, respectively. A square area of the panel 22 is punched downwardly to form a protrusion 220 (shown in FIG. 4) projecting downwardly beyond a bottom face the panel 22. A cavity 222 is formed corresponding to the protrusion 220 and located beneath a top face of the panel 22 to receive corresponding portions of the heat pipes 60 therein. A bottom surface of the protrusion 220 is entirely milled to be smooth enough to be in intimate contact with a top surface of the electronic component 82, whereby the heat generated by the electronic component 82 can be sufficiently and rapidly transferred to the lower plate 20 via the intimate contact between the protrusion 220 and the electronic component 82. In the preferred embodiment of the present invention, the protrusion 220 is located at a front part of the panel 22; nevertheless, a location of the protrusion 220 on the panel 22 can be varied according to the position of the electronic component 82. Corresponding portions of the sidewalls 24 and the flanges 26 to lateral sides of the cavity 228 are stamped outwardly and oppositely to form a pair of horizontal wings. The horizontal wings are coplanar with the panel 22. A pair of rectangular securing members 70 are securely disposed on the two wings of the lower plate 20, with an outer side of each securing member 70 being coincidental with an outer edge of a corresponding wing. A top of the each securing member 70 extends beyond a top surface of a corresponding flange 26 for engaging with the upper plate 30. A hole 700 is defined through each securing member 70 and each wing to provide a passage for a fastener (not shown), which is used for fastening the heat sink 10 to the printed circuit board 80.

The upper plate 30 is soldered on the two flanges 26 of the lower plate 20. The upper plate 30 has a periphery coincidental with a periphery of the lower plate 20. A pair of cutouts 32 are defined at each lateral side of the upper plate 30 corresponding to the wing. A tab 34 is formed between the two cutouts 32 at each lateral side of the upper plate 30, for resiliently abutting against a corresponding securing member 70. A total area of the two cutouts 32 and the tab 34 at each lateral side of the upper plate 30 is identical to an area of a top face of the securing member 70 (illustrated in FIG. 1). A circular hole 340 is defined in each tab 34 corresponding to the hole 700 in the wing and the securing member 70. The fastener extends through the circular hole 340 of the upper plate 30 and a corresponding hole 700 of the wing of the lower plate 20 and the securing member 70 to attach them on the printed circuit board 80 where the electronic component 82 is mounted.

Also referring to FIG. 5, the upper fin set 40 and the lower fin set 50 are fixed on the upper plate 30 and the lower plate 20 by soldering, respectively. Each of the upper fin set 40 and the lower fin set 50 comprises a plurality of parallel fins 42, 52, each of which consists of an upright sheet (not labeled) and a pair of hems (not labeled) bent horizontally from a top and a bottom of the sheet, respectively. The lower fin set 50 is secured on a rear part of the bottom face of the panel 22 (viewed from FIG. 4), by soldering upper hems of the fins 52 on the panel 22; the upper fin set 40 is secured on a whole top face of the upper plate 30, by soldering lower hems of the fins 42 on the upper plate 30. Every two adjacent fins 42, 52 forms a horizontal passage therebetween for allowing an airflow therethrough, thus enhancing a heat dissipating efficiency of the heat sink 10. The lower fin set 50 has a width similar to that of the panel 22, and the upper fin set 40 has a profile coincidental to that of the upper plate 30, and a width larger than that of the lower fin set 50 (shown in FIG. 5).

Figure 3:
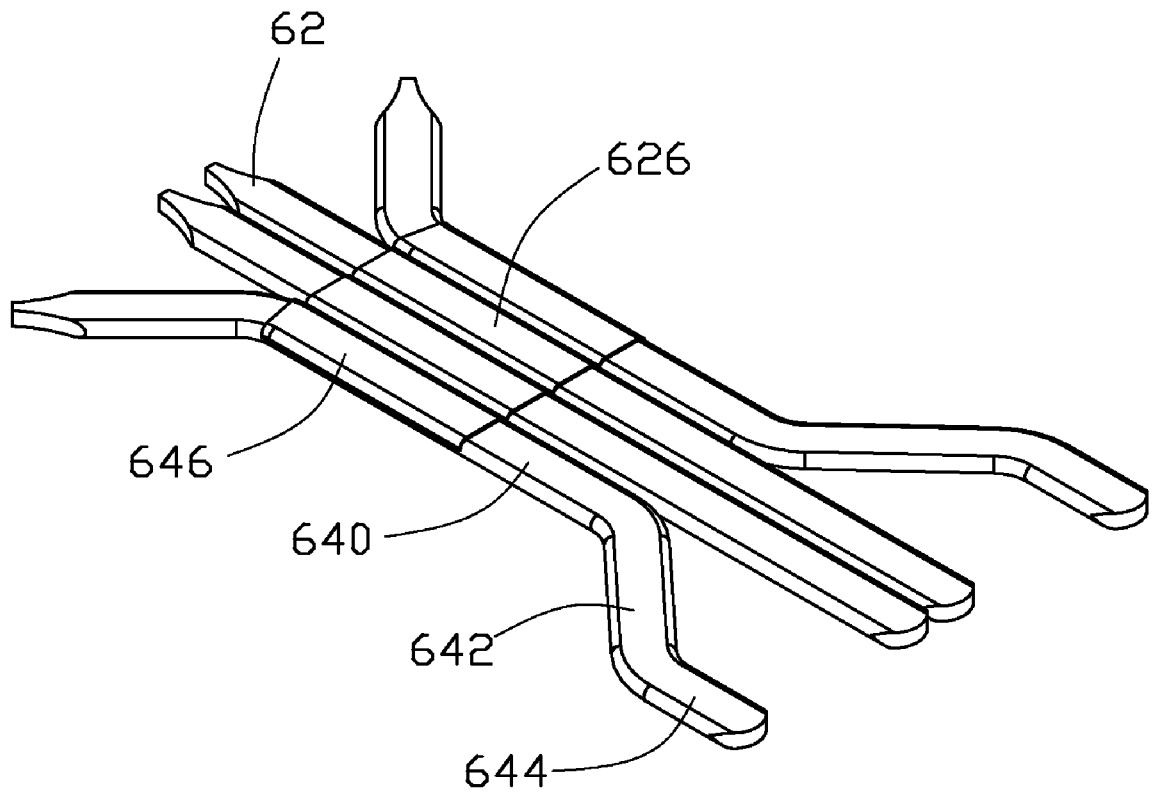
FIG. 3 is an enlarged view of heat pipes of the heat sink of FIG. 2 from another aspect.

As viewed from FIGS. 2-3, the heat pipes 60 are sandwiched between the upper plate 30 and the lower plate 20. In the preferred embodiment of the present invention, there are four heat pipes 60; however, the number of the heat pipes 60 is adjustable according to the amount of the heat that the electronic component 82 generates. Two middle heat pipes 62 of the four heat pipes 60 are straight and planar and parallel to each other; two lateral heat pipes 64 of the four heat pipes 60 are planar and each have a straight section 640 parallel to the two middle heat pipes 62, two bended sections 642 extending slantwise and outwardly from two opposite ends of the straight section 640, and an extremity end 644 extending rearwards from a rear bended section 642. Each bended section 642 of the two lateral heat pipes 64 defines an angle of approximate 135 degrees with the straight section 640. An arrangement of the four heat pipes 60 on the lower plate 20 is characterized in that: the two middle heat pipes 62 abut side-by-side against each other along a lengthwise direction of the lower plate 20, and the two lateral heat pipes 64 are juxtaposed with the two middle heat pipes 62 in a manner that the straight sections 640 thereof directly contact the two middle heat pipes 62, the bended sections 642 are inclinedly spaced from the two middle heat pipes 62, and the extremity ends 644 are gapped from the two middle heat pipes 62 in a parallel manner. A distance from a front end of a front bended section 642 to a rear end of the extremity end 644 of each lateral heat pipe 64 is identical to a length of the middle heat pipe 62. A distance between two extremity ends 644 of the two lateral heat pipes 64 is less than that between two sidewalls 24 of the lower plate 20, whereby when the four heat pipes 60 are fixed on the lower plate 20, the extremity ends 644 are spaced from the sidewalls 24 with a distance (illustrated in FIG. 5), which allows the airflow therethrough to thereby increase a heat dissipation of the heat sink 10. Each heat pipe 60 has a part projecting downwardly from a bottom face thereof to form a rectangular bulge 626, 646, which has a length less than that of the cavity 222 of the lower plate 20, and a thickness approximate to a depth of the cavity 222 of the lower plate 20. Four bulges 626, 646 are substantially accommodated into the cavity 222 and thermally contact a top surface of the panel 22 defining the cavity 222 to absorb heat therefrom.

In use, the heat sink 10 is disposed on the printed circuit board 80 with its protrusion 220 contacting with the electronic component 82. At this disposed position, the upper fin set 40 is located above the printed circuit board 80, and the lower fin set 50 extends downwardly beyond the printed circuit board 80 and has a part located lower than the printed circuit board 80. The heat generated by the electronic component 82 is absorbed by the protrusion 220, and is transferred to other portions of the heat pipes 60 via the bulges 626, 646. The heat pipes 60 distribute the heat over the upper plate 30 and the lower plate 20, which disperse the heat to the ambient via the lower fin set 50 and the upper fin set 40.

Since the bottom surface of the protrusion 220 is milled to be smooth, the contact between the protrusion 220 and the electronic component 82 can be ensured to be intimate enough that no gap exists therebetween to retard heat conduction from the electronic component 82 to the heat sink 10. Therefore, heat generated by the electronic component 82 is able to be sufficiently and rapidly transferred to the heat sink 10.

Furthermore, in the present invention, only the bottom surface of the protrusion 220 is milled, while other portions of the heat sink 10, such as the bottom face of the panel 22 around the protrusion 220, are not needed to be milled. Thus, a manufacturing time and cost of the heat sink 10 in accordance with the present invention can be reduced, in comparison with the conventional heat sink that the whole bottom face of the lower plate thereof needing to be milled.

In addition, the present invention also provides a method for manufacturing the heat sink 10 described hereinabove. The method comprises steps of: (1) providing a lower plate 20 with a protrusion 220 stamped downwardly therefrom; (2) milling a bottom surface of the protrusion 220 so that the bottom surface is highly flat and smooth; (3) providing a plurality of heat pipes 60 and soldering them on the lower plate 20; (4) providing an upper plate 30 and welding it on the lower plate 20 to sandwich the heat pipes 60 therebetween; (5) providing a plurality of fins 42, 52 and respectively weld them on the upper plate 30 and the lower plate 20.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink for dissipating heat from an electronic component, comprising:
   a lower plate forming a protrusion therefrom to contact the electronic component;
   an upper plate secured on the lower plate; and
   a plurality of heat pipes sandwiched between the lower plate and the upper plate;
   wherein a surface of the protrusion which is for contacting the electronic component is milled to be flat and smooth; and
   the lower plate comprises a panel forming the protrusion therefrom, a pair of sidewalls extending upwardly from two opposite sides of the panel, and a pair of flanges extending outwardly from tops of the pair of sidewalls, respectively.

2. The heat sink as claimed in claim 1, wherein only the surface of the protrusion is milled.

3. The heat sink as claimed in claim 1, wherein a cavity is defined in the lower plate corresponding to the protrusion.

4. The heat sink as claimed in claim 3, wherein the plurality of heat pipes forms bulges projecting downwardly therefrom to be received in the cavity in the lower plate.

5. The heat sink as claimed in claim 1, wherein the upper plate is fixed on the pair of flanges of the lower plate in parallel relationship with the panel.

6. The heat sink as claimed in claim 1, wherein the plurality of heat pipes is spaced from the pair of sidewalls of the lower plate to form air passages therebetween.

7. The heat sink as claimed in claim 1, wherein a pair of securing members are secured to a pair of horizontal wings at the opposite side of the panel of the lower plate, the wings being located corresponding to two lateral sides of the protrusion.

8. The heat sink as claimed in claim 7, wherein a pair of holes are defined through the pair of securing members and the pair of wings of the lower plate, respectively, adapted for extension of fasteners through the lower plate and the securing members to thereby attach the heat sink on a printed circuit board where the electronic component is mounted.

9. The heat sink as claimed in claim 7, wherein the securing members have tops extending beyond the flanges to resiliently engage the upper plate.

10. A method for manufacturing a heat sink, comprising steps of:
   providing a lower plate, the lower plate comprising a panel;
   punching the lower plate to form a downward protrusion located at the panel;
   milling a bottom surface of the protrusion so that the bottom surface is flat and smooth;
   providing a plurality of heat pipes and welding them on the lower plate; and
   providing an upper plate and soldering it on the plurality of heat pipes and the lower plate, wherein the plurality of heat pipes is sandwiched between the lower plate and the upper plate; and
   wherein the lower plate further comprises a pair of sidewalls extending upwardly from two opposite sides of the panel, and a pair of flanges extending outwardly from tops of the pair of sidewalls, respectively.

11. The method for manufacturing a heat sink as claimed in claim 10, further comprising a step of: providing a plurality of fins and welding them on the lower plate and the upper plate respectively.

12. A heat sink comprising:
   a lower plate having a lower protrusion extending downwards from a bottom face thereof and a cavity in a top face thereof corresponding to the lower protrusion, wherein a bottom surface of the lower protrusion is used to contact a top surface of a heat-generating electronic component, the bottom surface of the lower protrusion being machined to be flat and smooth so that the bottom surface can have an intimate contact with the top surface of the heat-generating electronic component; and
   a plurality of first fins mounted over the top face of the lower plate;
   wherein the lower plate comprises a panel forming the protrusion therefrom, a pair of sidewalls extending upwardly from two opposite sides of the panel, and a pair of flanges extending outwardly from tops of the pair of sidewalls, respectively.

13. The heat sink as claimed in claim 12, further comprising an upper plate mounted on the lower plate, at least a heat pipe sandwiched between the lower and upper plates and a plurality of second fins mounted on the bottom face of the lower plate, wherein the first fins are mounted on a top face of the upper plate.

14. The heat sink as claimed in claim 13, wherein the at least a heat pipe has a bulge extending into the cavity defined in the top face of the lower plate.

* * * * *